United States Patent [19]

Shieh et al.

[11] Patent Number: 5,280,445
[45] Date of Patent: Jan. 18, 1994

[54] MULTI-DIMENSIONAL MEMORY CELL USING RESONANT TUNNELING DIODES

[75] Inventors: Ming-Huei Shieh, College Park; Hung C. Lin, Silver Spring, both of Md.

[73] Assignee: University of Maryland, College Park, Md.

[21] Appl. No.: 940,226

[22] Filed: Sep. 3, 1992

[51] Int. Cl.⁵ .................. G11C 5/06; G11C 11/56
[52] U.S. Cl. .......................... 365/175; 365/71; 365/72; 365/168
[58] Field of Search ............. 365/168, 71, 72, 175, 365/105

[56] References Cited

U.S. PATENT DOCUMENTS

| | | | |
|---|---|---|---|
| 3,544,977 | 12/1970 | Bohner | 365/175 |
| 3,916,392 | 10/1975 | Richardson | 365/175 |
| 4,573,143 | 2/1986 | Matsukawa | 365/175 |
| 5,128,894 | 7/1992 | Lin | 365/72 X |

FOREIGN PATENT DOCUMENTS

| | | | |
|---|---|---|---|
| 0045495 | 3/1986 | Japan | 365/175 |
| 0208494 | 9/1987 | Japan | 365/175 |

Primary Examiner—Eugene R. LaRoche
Assistant Examiner—Son Dinh
Attorney, Agent, or Firm—Christopher N. Sears

[57] ABSTRACT

A number of resonant tunneling diodes are connected in series with a resistor, a current source or a load device. A bit line is connected to every joint between any two devices through a switch. When properly biased, there can be $(N+1)^m$ number of stable quantized operating points which are represented by a combination of m variables (of either voltage or current, where N is the number of peaks of the folding I-V characteristic and m is the number of bit lines. The m bit lines can write in $(N+1)^m$ different combinations of inputs. During reading, the quantized voltage (or current) at each bit line is sensed. The number of stable states can be doubled by changing the polarity of the power supply.

28 Claims, 21 Drawing Sheets

| state variable | $S_{11}\ S_{12}\ \cdots\ S_{1(N+1)}$ | $S_{21}\ S_{22}\ \cdots\ S_{2(N+1)}$ | $\cdots\cdots$ | $S_{(N+1)1}\ S_{(N+1)2}\ \cdots\ S_{(N+1)(N+1)}$ |
|---|---|---|---|---|
| $V_L$ | $1_L\ 1_L\ \cdots\ 1_L$ | $2_L\ 2_L\ \cdots\ 2_L$ | $\cdots\cdots$ | $(N+1)_L\ (N+1)_L\ \cdots\ (N+1)_L$ |
| $V_H$ | $1_H\ 2_H\ \cdots\ (N+1)_H$ | $1_H\ 2_H\ \cdots\ (N+1)_H$ | $\cdots\cdots$ | $1_H\ 2_H\ \cdots\ (N+1)_H$ |

Fig. 4(d)

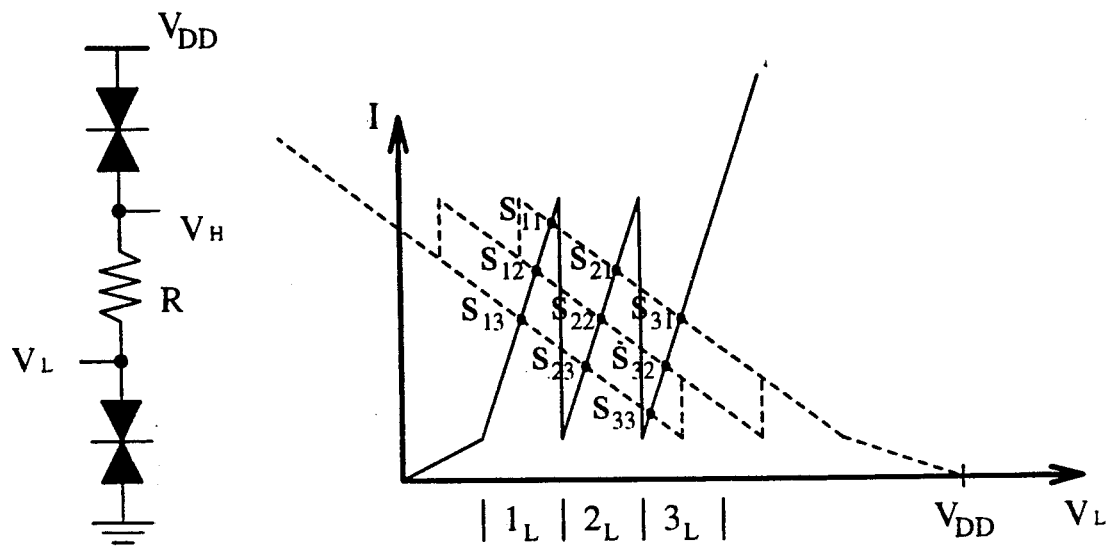
Fig. 6(a)  Fig. 6(b)
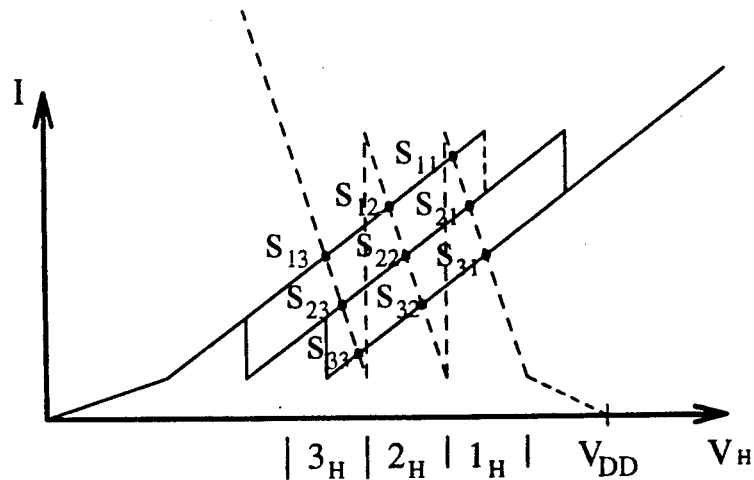
Fig. 6(c)
| state | $S_{11}$ | $S_{12}$ | $S_{13}$ | $S_{21}$ | $S_{22}$ | $S_{23}$ | $S_{31}$ | $S_{32}$ | $S_{33}$ |
|---|---|---|---|---|---|---|---|---|---|
| $V_L$ | $1_L$ | $1_L$ | $1_L$ | $2_L$ | $2_L$ | $2_L$ | $3_L$ | $3_L$ | $3_L$ |
| $V_H$ | $1_H$ | $2_H$ | $3_H$ | $1_H$ | $2_H$ | $3_H$ | $1_H$ | $2_H$ | $3_H$ |
Fig. 6(d)

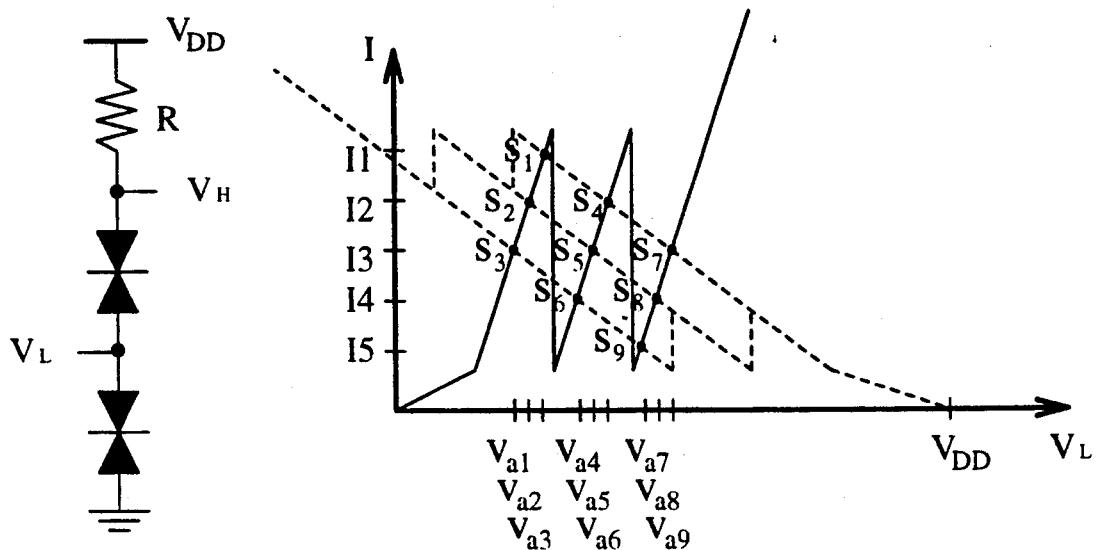
Fig. 7(a)  Fig. 7(b)
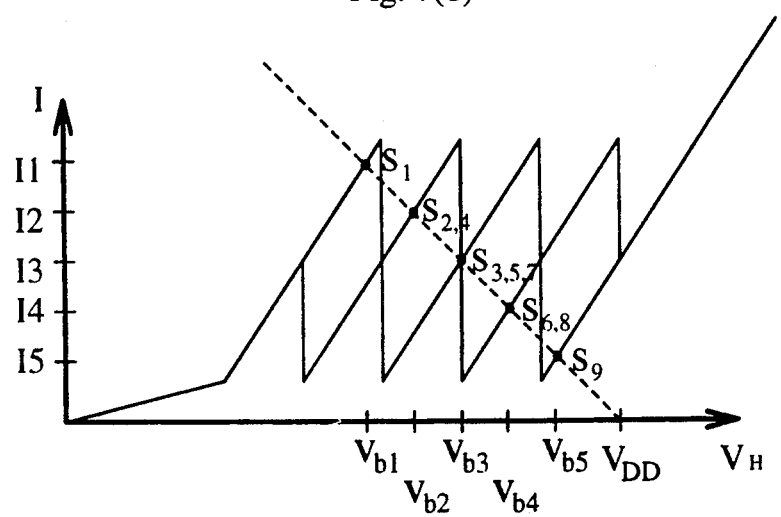
Fig. 7(c)
| state | $S_1$ | $S_2$ | $S_3$ | $S_4$ | $S_5$ | $S_6$ | $S_7$ | $S_8$ | $S_9$ |
|---|---|---|---|---|---|---|---|---|---|
| $V_L$ | $V_{a3}$ | $V_{a2}$ | $V_{a1}$ | $V_{a6}$ | $V_{a5}$ | $V_{a4}$ | $V_{a9}$ | $V_{a8}$ | $V_{a7}$ |
| $V_H$ | $V_{b1}$ | $V_{b2}$ | $V_{b3}$ | $V_{b2}$ | $V_{b3}$ | $V_{b4}$ | $V_{b3}$ | $V_{b4}$ | $V_{b5}$ |
Fig. 7(d)

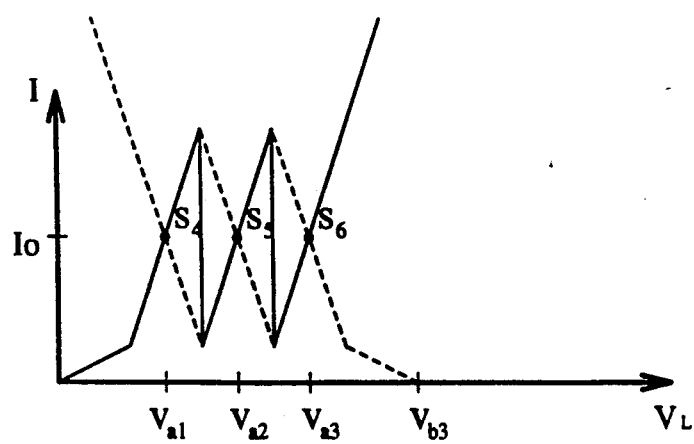
Fig. 9(e)
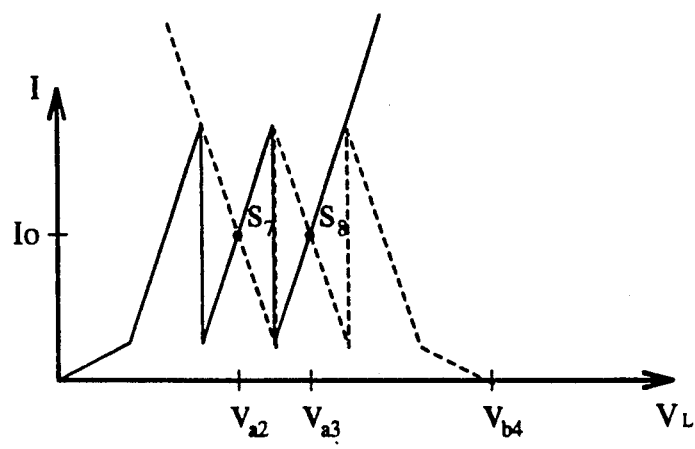
Fig. 9(f)
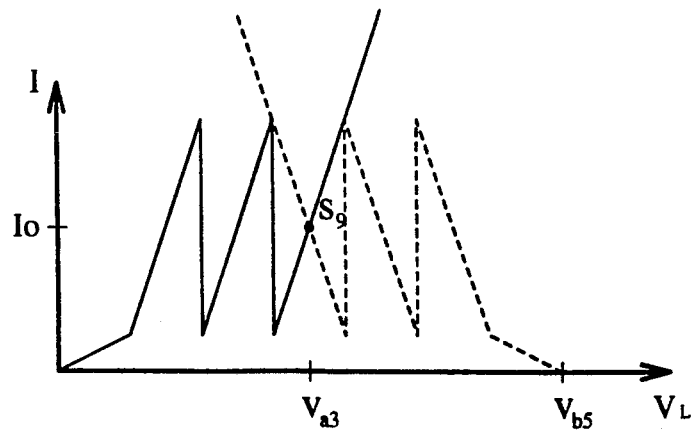
Fig. 9(g)
| state | $S_1$ | $S_2$ | $S_3$ | $S_4$ | $S_5$ | $S_6$ | $S_7$ | $S_8$ | $S_9$ |
|---|---|---|---|---|---|---|---|---|---|
| $V_L$ | $V_{a1}$ | $V_{a1}$ | $V_{a2}$ | $V_{a1}$ | $V_{a2}$ | $V_{a3}$ | $V_{a2}$ | $V_{a3}$ | $V_{a3}$ |
| $V_H$ | $V_{b1}$ | $V_{b2}$ | $V_{b2}$ | $V_{b3}$ | $V_{b3}$ | $V_{b3}$ | $V_{b4}$ | $V_{b4}$ | $V_{b5}$ |
Fig. 9(h)

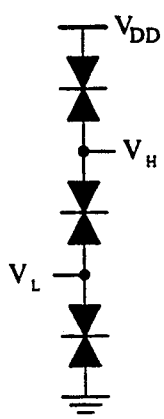
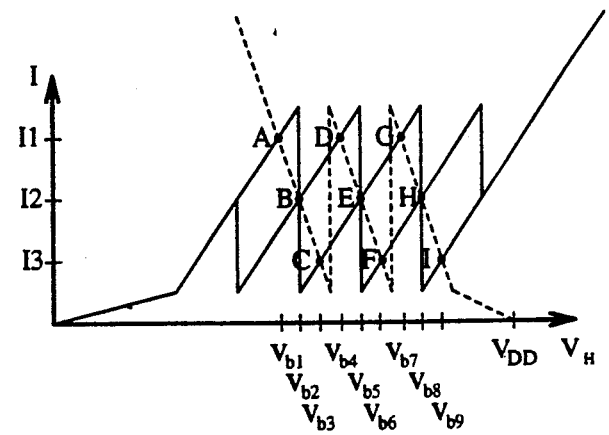
Fig. 10(a)  Fig. 10(b)
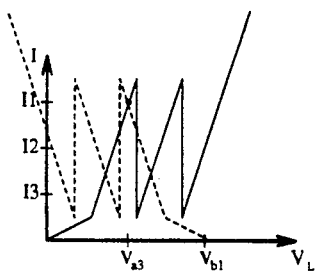
Fig. 10(c)
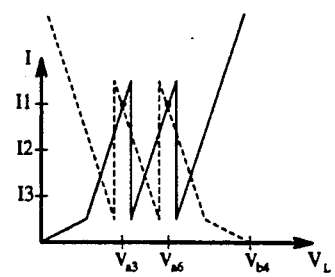
Fig. 10(f)
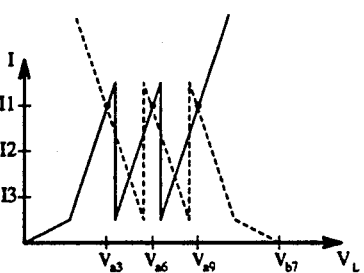
Fig. 10(i)
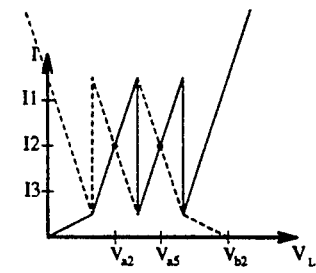
Fig. 10(d)
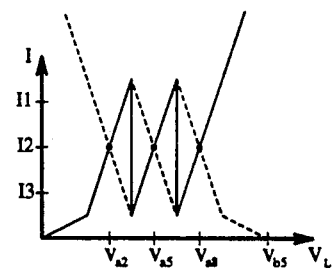
Fig. 10(g)
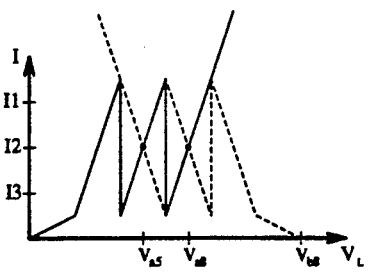
Fig. 10(j)
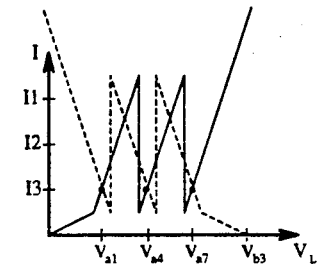
Fig. 10(e)
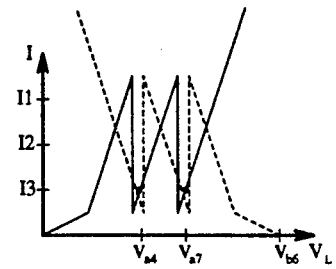
Fig. 10(h)
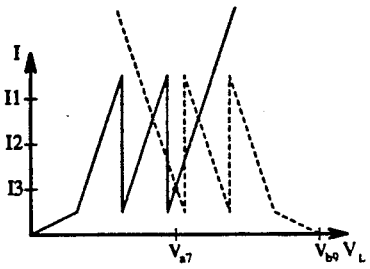
Fig. 10(k)

| state | $S_1$ | $S_2$ | $S_3$ | $S_4$ | $S_5$ | $S_6$ | $S_7$ | $S_8$ | $S_9$ | $S_{10}$ | $S_{11}$ | $S_{12}$ | $S_{13}$ | $S_{14}$ | $S_{15}$ | $S_{16}$ | $S_{17}$ | $S_{18}$ | $S_{19}$ |
|---|---|---|---|---|---|---|---|---|---|---|---|---|---|---|---|---|---|---|---|
| $V_L$ | $V_{a3}$ | $V_{a2}$ | $V_{a5}$ | $V_{a1}$ | $V_{a4}$ | $V_{a7}$ | $V_{a3}$ | $V_{a6}$ | $V_{a2}$ | $V_{a5}$ | $V_{a8}$ | $V_{a4}$ | $V_{a7}$ | $V_{a3}$ | $V_{a6}$ | $V_{a9}$ | $V_{a5}$ | $V_{a8}$ | $V_{a7}$ |
| $V_H$ | $V_{b1}$ | $V_{b2}$ | $V_{b2}$ | $V_{b3}$ | $V_{b3}$ | $V_{b3}$ | $V_{b4}$ | $V_{b4}$ | $V_{b5}$ | $V_{b5}$ | $V_{b5}$ | $V_{b6}$ | $V_{b6}$ | $V_{b7}$ | $V_{b7}$ | $V_{b7}$ | $V_{b8}$ | $V_{b8}$ | $V_{b9}$ |

Fig. 10(l)

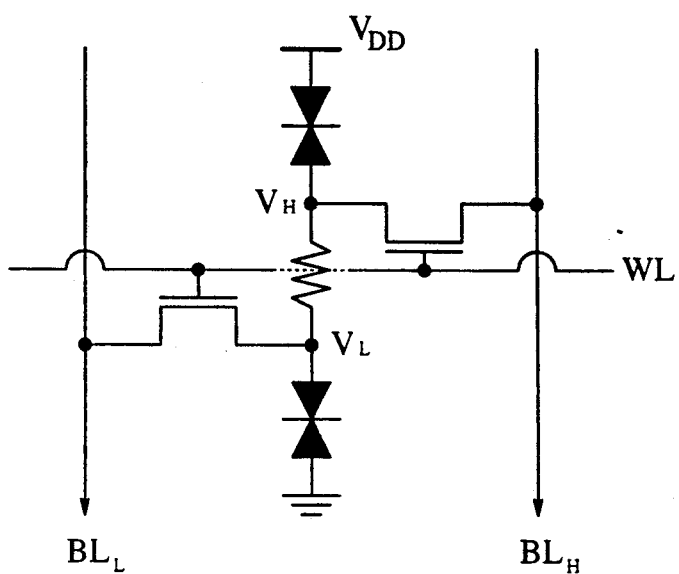
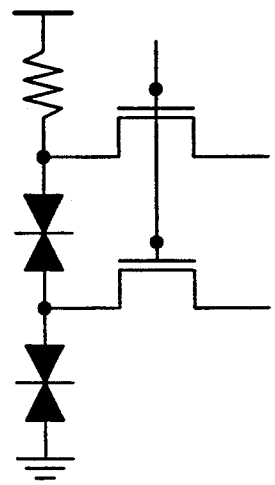
Fig. 11(a)                           Fig. 11(b)
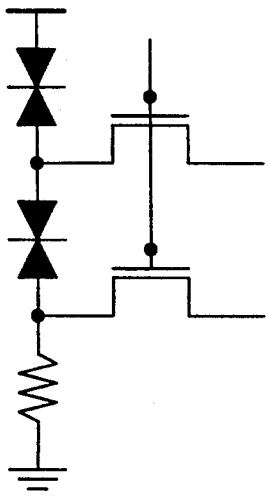 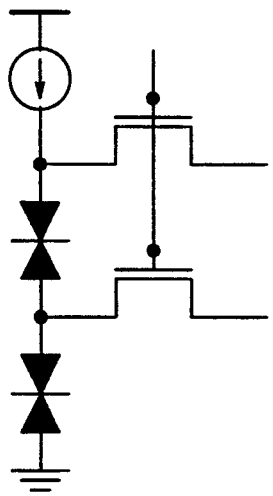 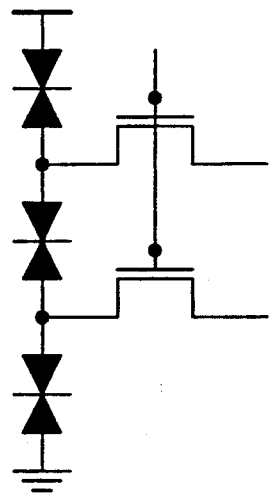
Fig. 11(c)          Fig. 11(d)          Fig. 11(e)

MULTI-DIMENSIONAL MEMORY CELL USING RESONANT TUNNELING DIODES

BACKGROUND

A typical digital system requires a large number of memory cells. Since the introduction of semiconductor memory, the number of storage states in an integrated circuit has been increasing at an exponential rate. In a conventional binary digital system, a memory cell can only store two states, "0" and "1", and a large number of memory cells are integrated to obtain large memory capacity. A resonant tunneling diode (RTD) has a folding current-voltage (I-V) characteristic. When the RTD is connected in series with a resistor or a current source as a load, there can be (N+1) stable operating points or storage states, where N is the number of current peaks of the RTD. When such multiple-valued storage states instead of binary states are used in a memory cell, the number of memory cells can be reduced.

U.S. Pat. No. 5,128,894 discloses that the number of stored states of N-peaked RTD memory cell can be increased to 2N+1 when a resistor is connected in series with the RTD to skew the I-V characteristic to a saw-tooth shape. The devices as taught were limited to a single node input-output line. In the continuation-in-part (CIP) application (Ser. No. 07/871806) and a negative power supply are used in a device as taught by the U.S. Pat. No. 5,128,894 that allows for the number of stored states to be doubled to 2(2N+1). Both of these teachings are restricted to using only a single node line input-output means for the memory cell.

Although a two-fold to four-fold increase in memory states represents is an improvement, it does not keep pace with the exponential increase in memory requirement of the present-day digital system. Furthermore, the power dissipation becomes a limiting factor when a very large number of 2(2N+1) type memory cells are connected in parallel. It is desirable to achieve a quantum increase in the number of storage states to accommodate the ever increasingly complex modern digital systems at minimum power dissipation. To accomplish this objective, a memory cell with a multiple node input-output from the device is disclosed below.

SUMMARY

An object of the present invention is to increase the storage states of a memory cell. Another object of the present invention is to decrease the power dissipation per bit of memory storage. A further object of this invention is to implement a memory cell in multi-dimensions.

These objects are achieved by connecting a number of RTDs in series. When an N-peak RTD is biased with a current source, there can be (N+1) different stable quantized states. When m-number N-peak RTDs are connected in series with a current source or a resistor, there are $(N+1)^m$ different combinations of stored states. The state is defined by the voltage across each RTD. In another mode of operation, the RTDs are connected in series with a resistor to produce hysteresis in the folding I-V characteristic. When the RTD has multiple current peaks, the hysteresis characteristics can overlap. Thus, for a single positive resistance load line, there can be multiple quanta of stable operating points with different combinations of currents and voltages. For a load line with multiple folding positive resistance regions, there can be other multiple quanta of operating points. Thus, the stable states can be represented by different combinations of node voltages or combination of node voltages and series current.

The memory states can further be doubled by using opposite polarity power supply to utilize the bi-directional property of the RTDs. By so doing, the number of memory states can be increased to $2(N+1)^m$. This number represents many orders of increase over the prior art, 2(2N+1) type memory cell. For instance, using two 5-peak RTDs, the present invention can produce 72 different stable states as compared to 22 states for the previously disclosed 2(2N+1) type memory cell. The difference is more dramatic as the number of RTDs increase.

BRIEF DESCRIPTION OF THE DRAWINGS

FIG. 4(d) shows the $(N+1)^2$ stable states with different combinations of the voltage range at node L and node H.

FIGS. 6(a)-(d) are the similar to FIGS. 4(a)-(d) except that 2-peak RTDs are used instead of N-peak RTDs.

FIG. 7(a) shows another version of two-dimensional memory cell of this invention by connecting two 2-peak RTDs in series with a resistor which is placed on top. FIG. 7(b) shows how stable operating points at node L of the memory cell in FIG. 7(a) can be obtained graphically by taking both the resistor and the upper RTD as a load and intersecting the hysteresis loops of the load with the I-V curve of the pull-down RTD. FIG. 7(c) shows how stable operating points at node H of the memory cell in FIG. 7(a) can be obtained graphically by taking the upper RTD as the load and intersecting the hysteresis loops of the pull-down resistor and lower RTD combination. FIG. 7(d) shows the nine stable states with different combinations of the voltage at node L and node H.

Figure 9A:
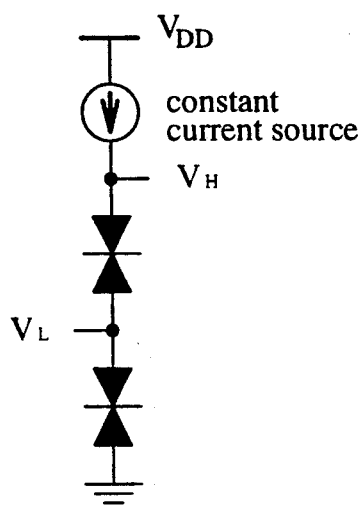
Figure 9B:
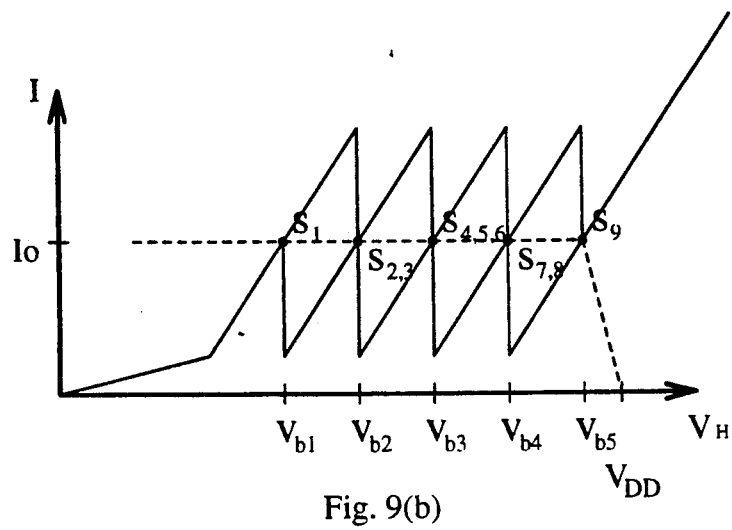
Figure 9C:
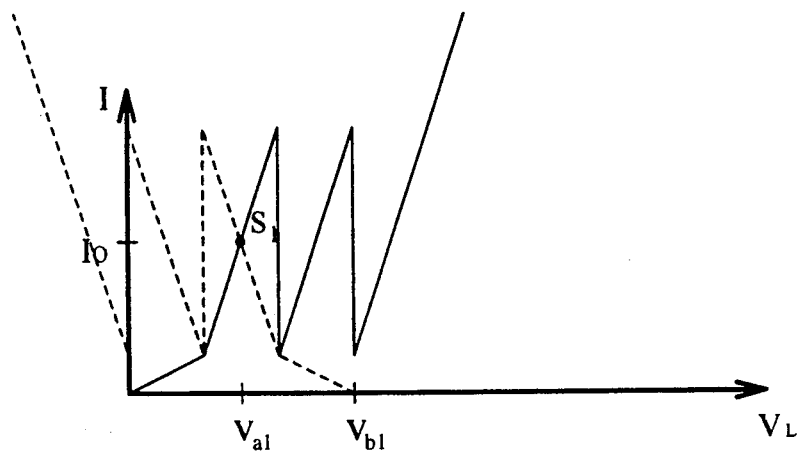
Figure 9D:
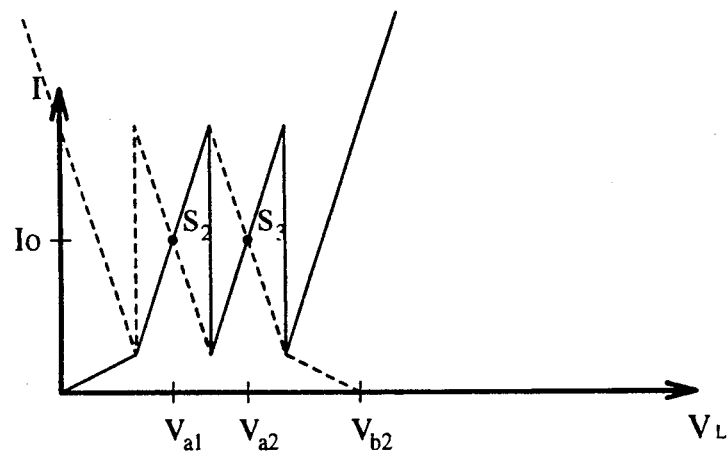

FIG. 9(a) shows another version of two-dimension memory cell of this invention by connecting two 2-peak RTDs in series with a current source. FIG. 9(b) shows how stable operating points at node H of the memory cell in FIG. 9(a) can be obtained graphically by applying the load line technique. FIGS. 9(c), (d), (e), (f), (g) show how stable operating points at node L of the memory cell in FIG. 9(a) can be obtained graphically by taking the upper RTD as a load and taking $V_{b1}$, $V_{b2}$, $V_{b3}$, $V_{b4}$, $V_{b5}$, respectively as a power supply voltage when the voltage at node H is $V_{b1}$, $V_{b2}$, $V_{b3}$, $V_{b4}$, $V_{b5}$ respectively. FIG. 9(h) shows the nine stable states with different combinations of the voltage at node L and node H.

FIG. 10(a) shows fifth version of a two-dimensional memory cell of this invention by connecting three 2-peak RTDs only in series. FIG. 10(b) shows how stable operating points at node H of the memory cell in FIG. 10(a) can be obtained graphically by applying the load line technique. FIGS. 10(c)–(k) show graphically how different voltages at node L can be obtained for different voltages at node H. FIG. 10(l) shows the nineteen stable states with all possible combinations.

FIGS. 11(a), (b), (c), (d), (e) show memory cells complete with accessing switches for FIGS. 6(a), 7(a), 8, 9(a), 10(a).

Figure 12A:
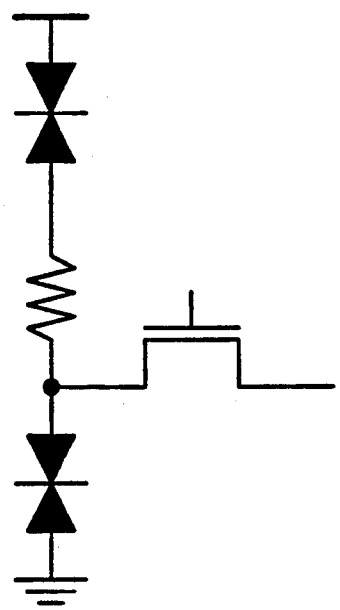
Figure 12B:
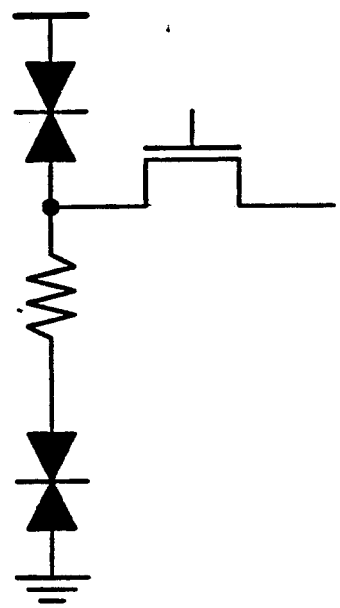
Figure 12C:
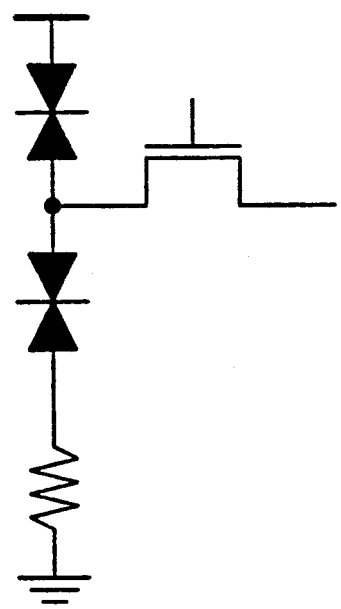
Figure 12D:
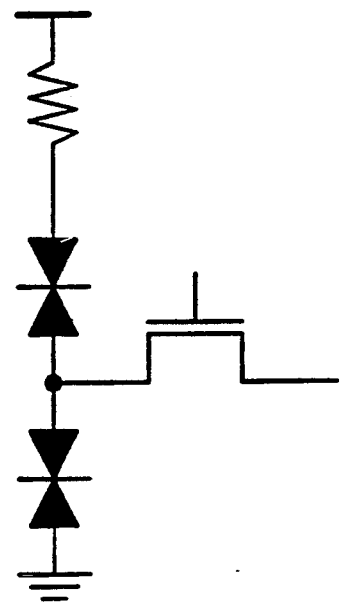

FIGS. 12(a), (b), (c), and (d) show some other versions of complete memory cell which is composed of two RTDs in series with a resistor placed in the middle, bottom or top. The memory cell is accessed by a single bit line at the lower or the high node and has a hysteresis voltage-current characteristic to achieve $(N+1)^2$ operating points.

Figure 13A:
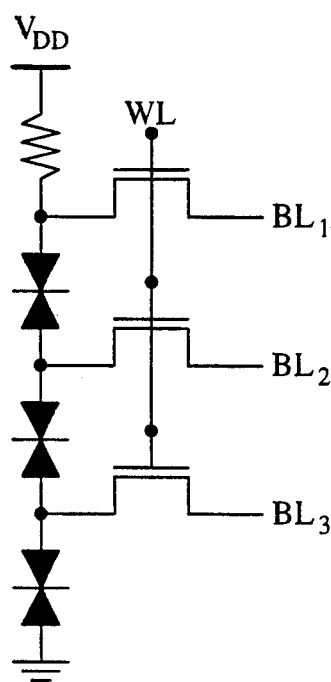
Figure 13B:
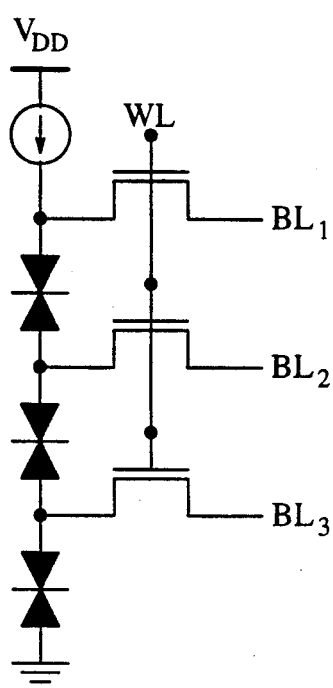
Figure 13C:
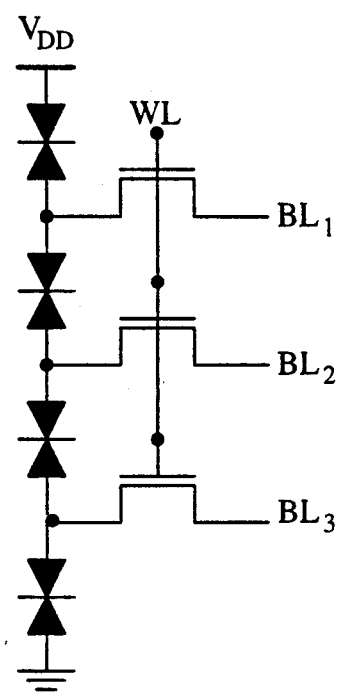

FIG. 13(a) shows a basic complete three-dimensional memory cell of this invention by connecting three RTDs in series with a resistor. FIG. 13(b) shows another version of a complete three-dimensional memory cell by connecting three RTDs in series with a current source. FIG. 13(c) shows still another version of a complete three-dimensional memory cell by connecting four RTDs only in series.

Figure 14A:
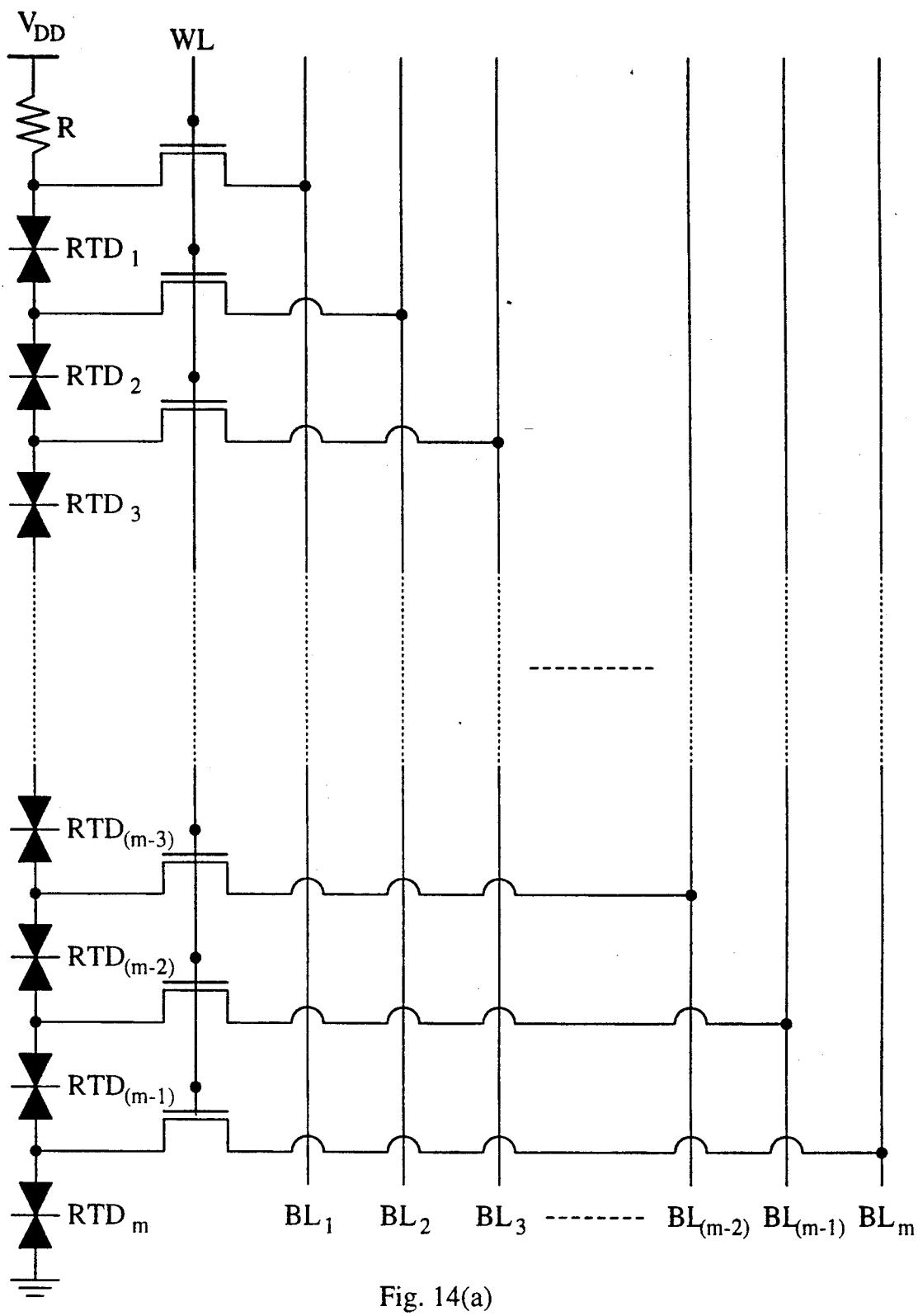
Figure 14B:
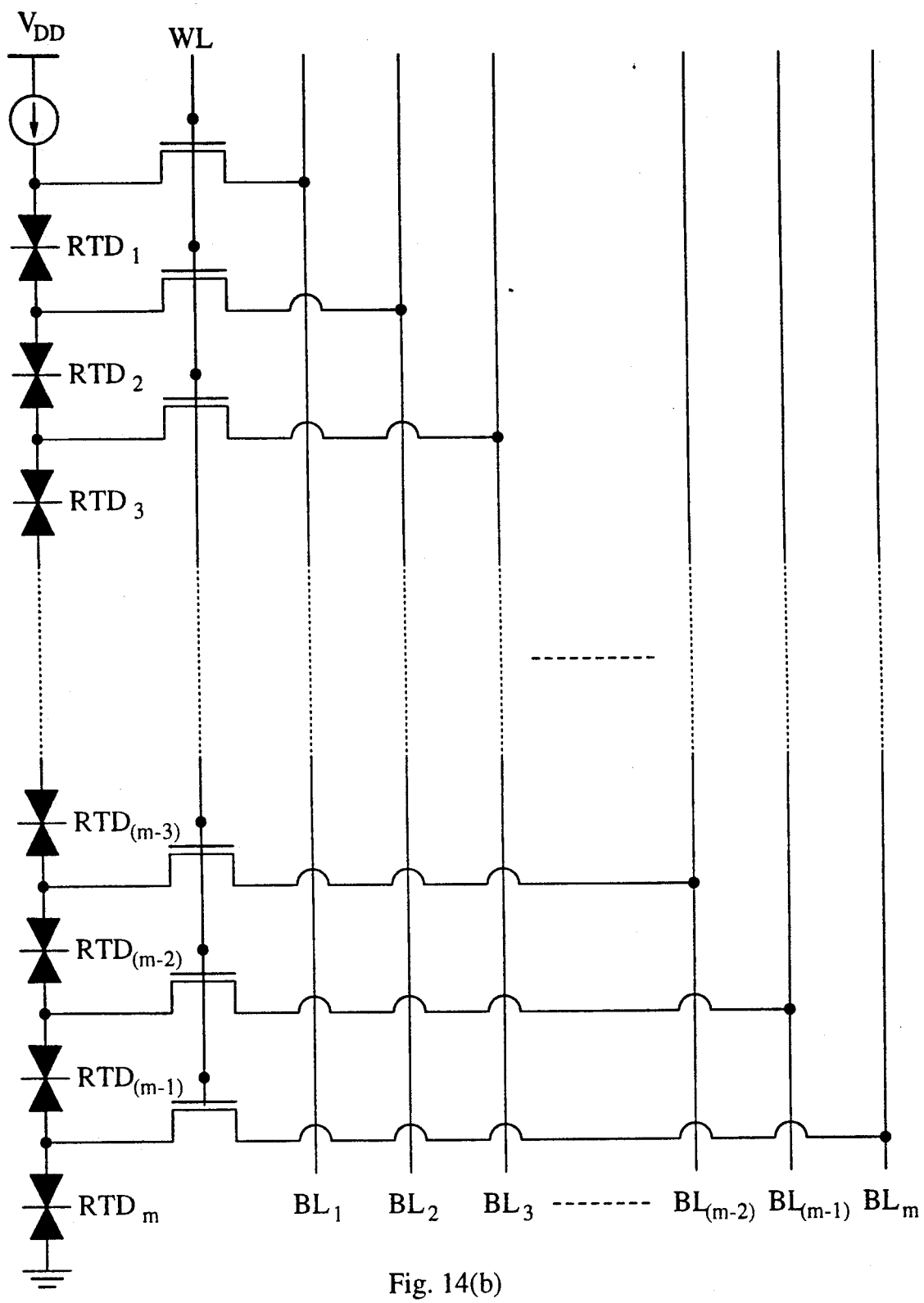
Figure 14C:
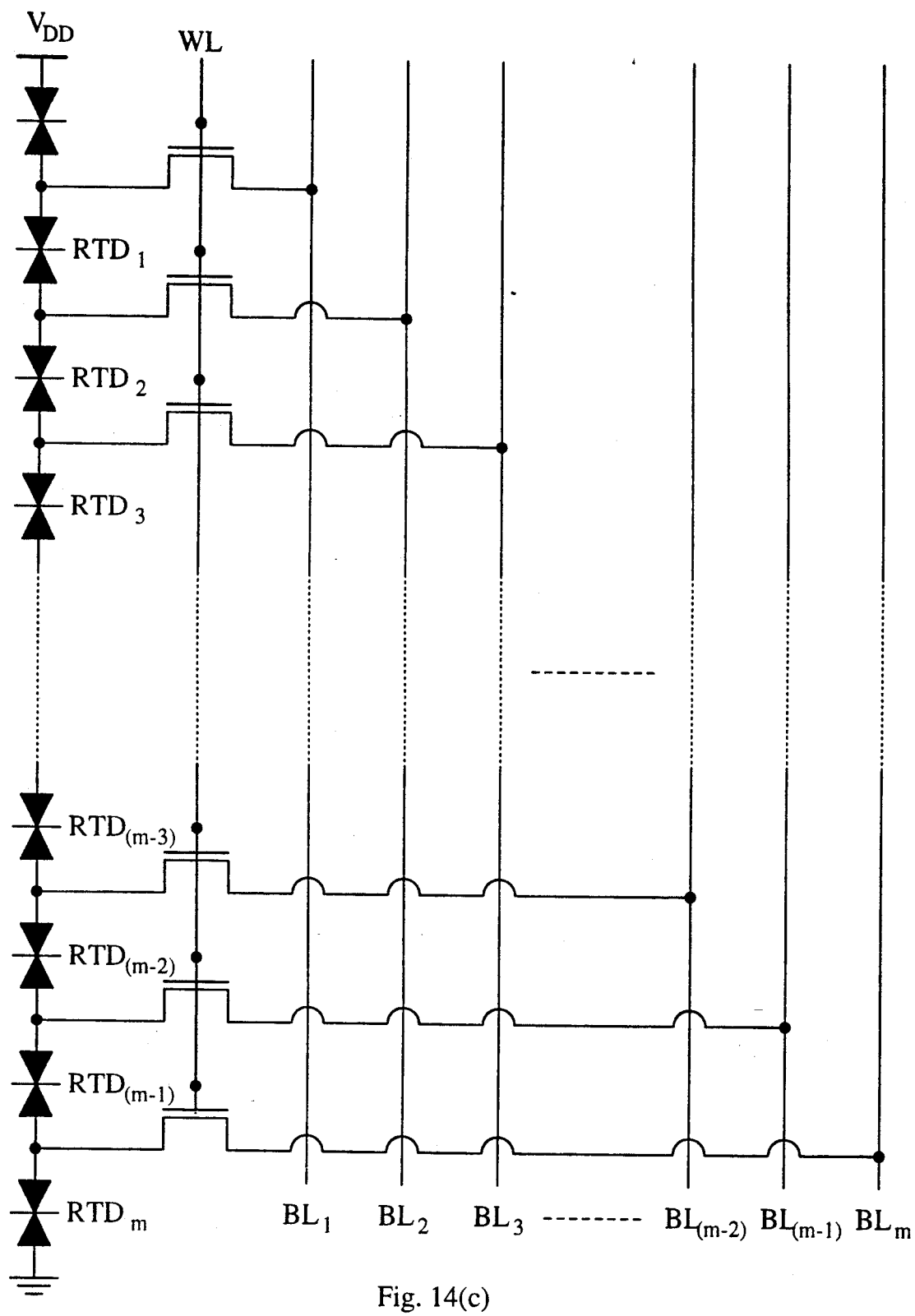

FIG. 14(a) shows a basic complete m-dimensional memory cell of this invention by connecting m RTDs in series with a resistor placed on the top. FIG. 14(b) shows another version of a complete m-dimensional memory cell of this invention by connecting m RTDs in series with current source. FIG. 14(c) shows still another version of a complete m-dimension memory cell of this invention by connecting (m+1) RTDs only in series.

Figure 15:
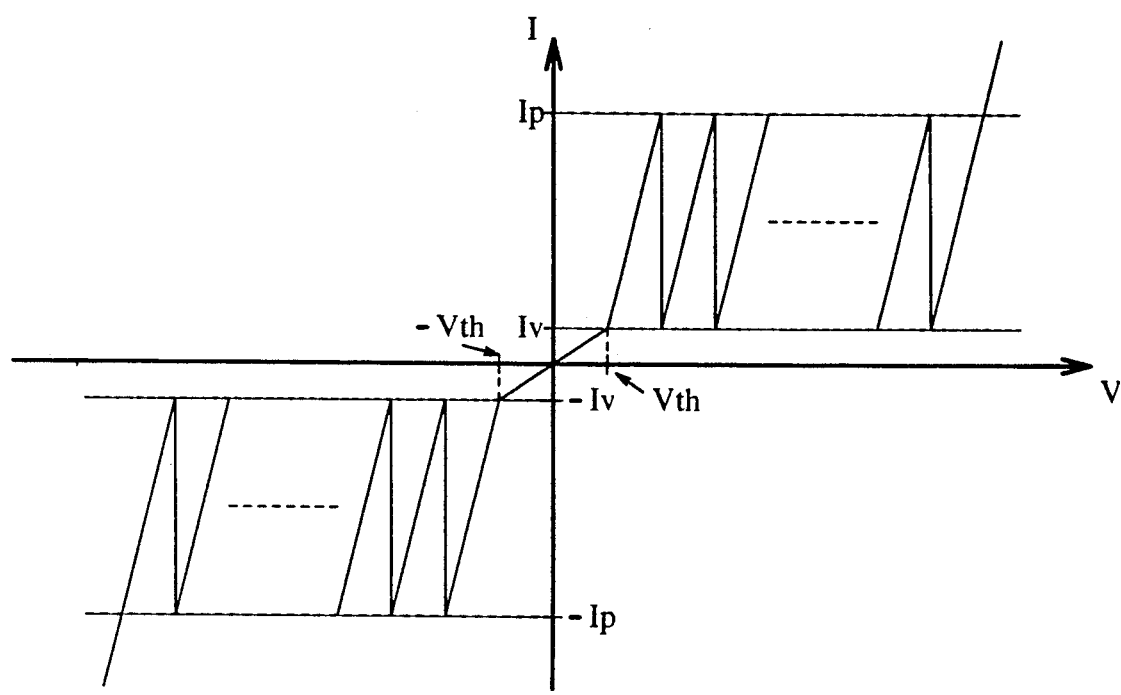

FIG. 15 shows both the first quadrant and the third quadrant of I-V curve of an N-peak RTD.

Figure 16:
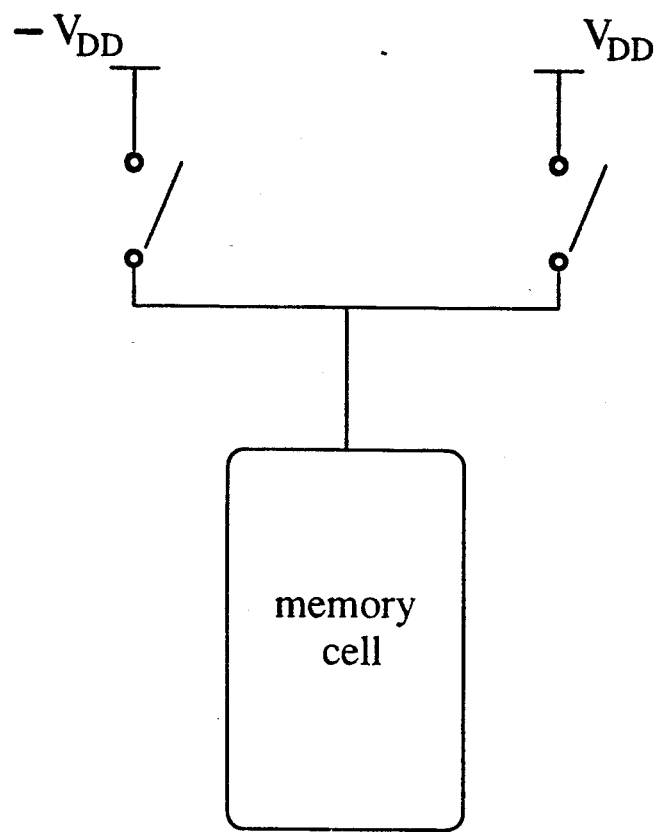

FIG. 16 shows a memory cell in which the polarity of power is reversible so that the operating points can be in the first quadrant or in the third quadrant of the RTD I-V characteristic.

DETAILED DESCRIPTION OF THE PREFERRED EMBODIMENT

Figure 1A:
FIG. 1(a) shows the symbol of an RTD.
Figure 1B:
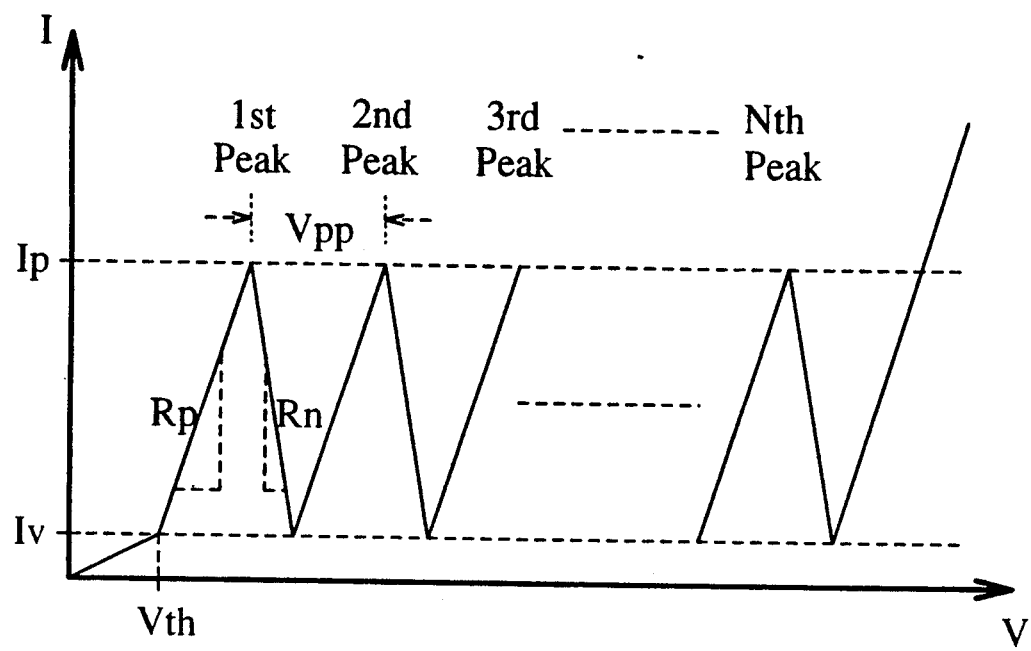
FIG. 1(b) shows the piecewise linear folding I-V characteristic of an N-peak RTD.
Figure 1C:
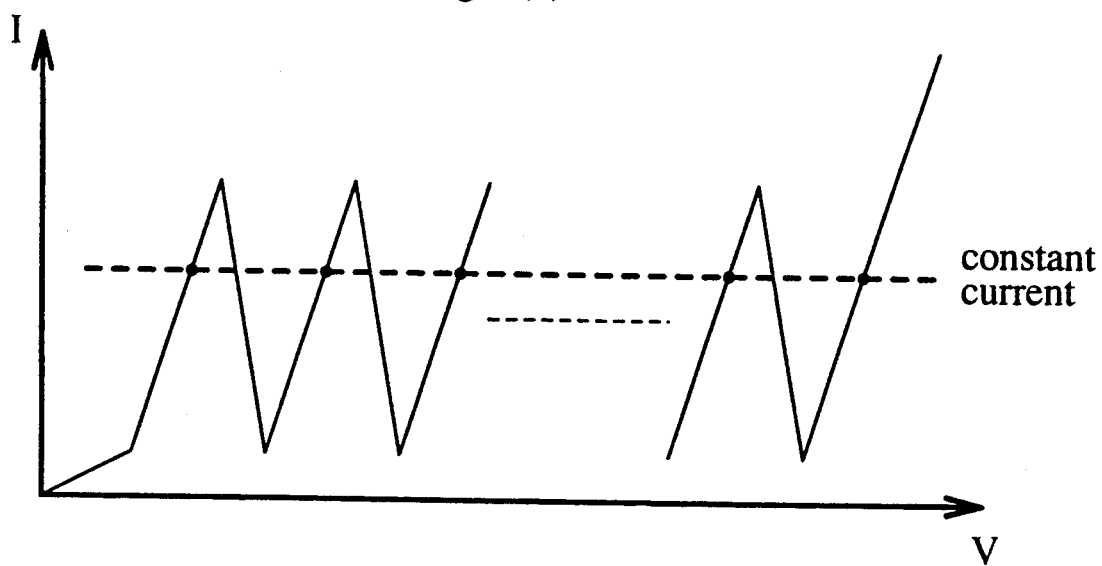
FIG. 1(c) shows (N+1) operating voltages when the RTD is biased with a constant current.
Figure 2A:
FIG. 2(a) shows an RTD connected with a resistor.
Figure 2B:
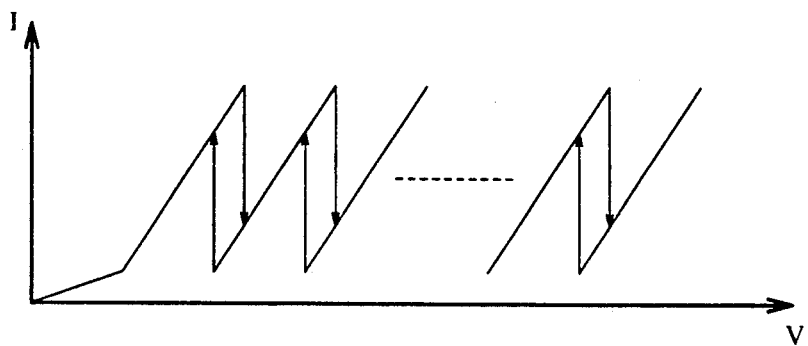
FIG. 2(b) shows the combined I-V characteristic with hysteresis loops where the series resistance is larger than the magnitude of the negative resistance of the RTD.
Figure 2C:
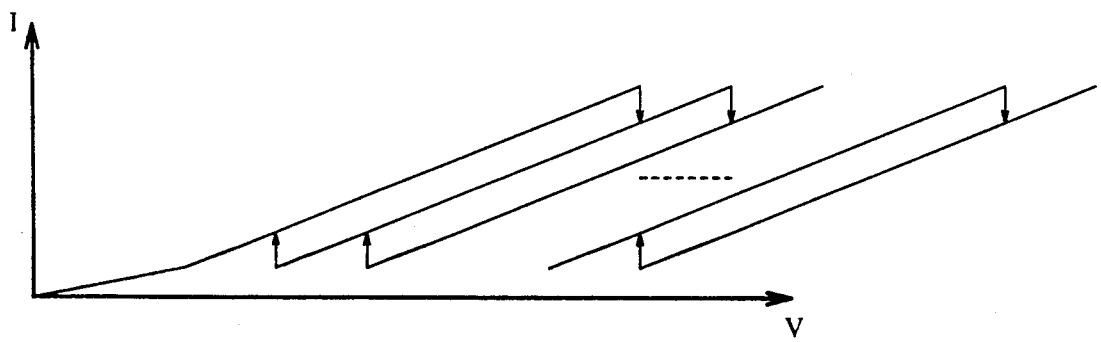
FIG. 2(c) shows the overlapping of the hysteresis loops when the series resistance is further increased.

FIG. 1(a) represents the symbol of an RTD. FIG. 1(b) shows the piece-wise linear representation of the folding I-V characteristic of an RTD in the first quadrant. As the voltage across the RTD increases, the current goes through peaks and valleys many times with alternate positive differential resistance region Rp and negative differential resistance region Rn. When a resistor 12 is connected in series with the RTD 11 as shown in FIG. 2(a), the positive differential resistance is increased and the negative differential resistance is decreased. When the series resistance is increased to a value larger than the magnitude of the negative resistance, the resultant I-V characteristic displays hysteresis as shown in FIG. 2(b). When the value of the series resistance is further increased, then the hysteresis loops are elongated and may overlap as shown in FIG. 2(c). Then, there are as many hysteresis loops as there are current peaks.

Figure 3:
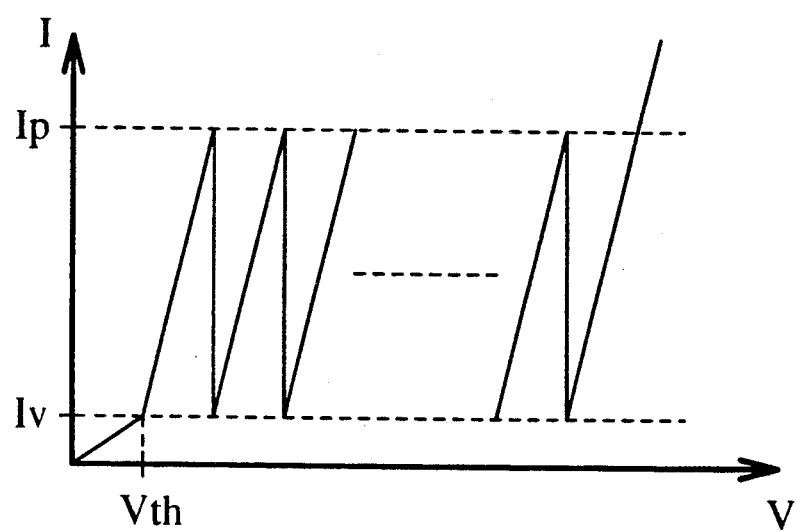
FIG. 3 shows the piecewise linear I-V curve of an N-peak RTD.
Figure 4A:
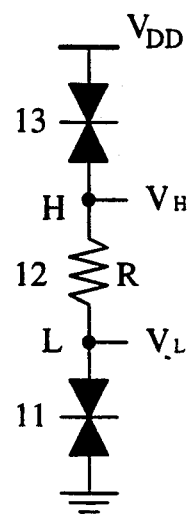
FIG. 4(a) shows a basic two-dimensional memory cell of this invention by connecting two N-peak RTDs in series with a resistor connected between the two RTDs.
Figure 4B:
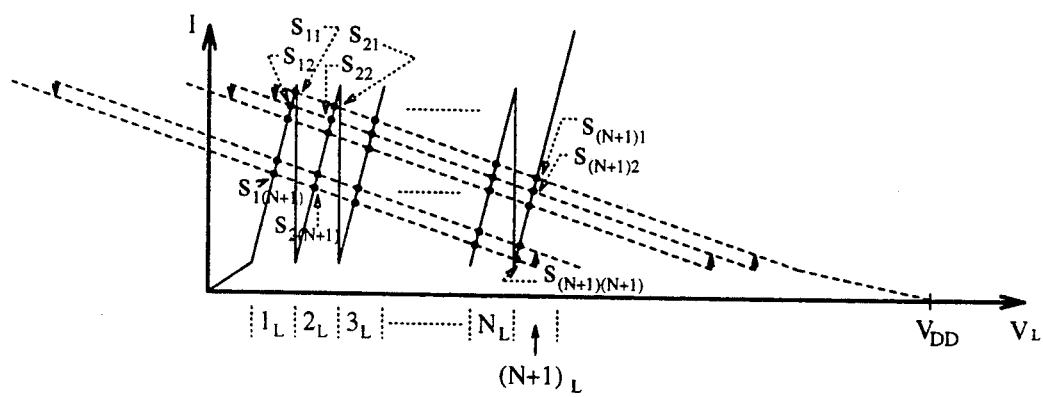
FIG. 4(b) shows how stable operating points at node L of the memory cell in FIG. 4(a) can be obtained graphically by taking both the upper RTD and the resistor as a load and intersecting the hysteresis loops of the load with the I-V curve of the pull-down RTD.
Figure 4C:
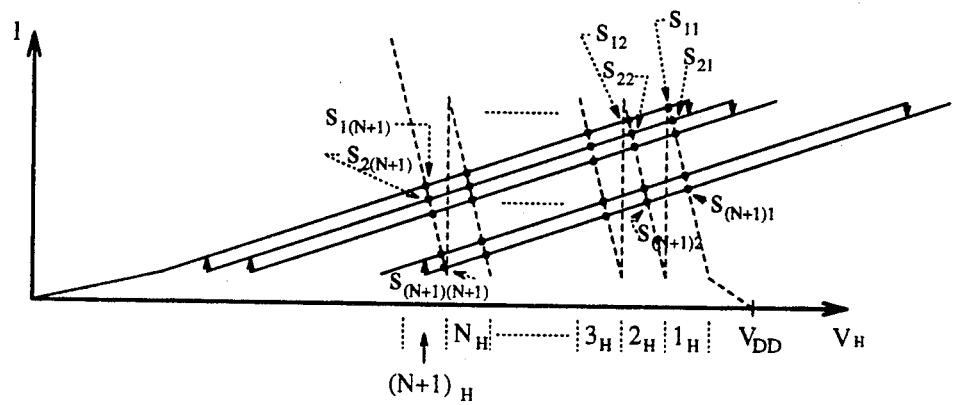
FIG. 4(c) shows how stable operating points at node H of the memory cell in FIG. 4(a) can be obtained graphically by taking the upper RTD only as a load and intersecting its characteristic with the hysteresis loops of the pull-down RTD in series with the resistor.

FIG. 3 shows the simplified piece-wise linear I-V curve of an N-peak RTD. When two N-peak RTDs are connected in series with a resistor which is placed between the two RTDs as a memory cell shown in FIG. 4(a), the memory cell can have $(N+1)^2$ stable states when a proper value of resistance R and a proper power supply voltage are chosen. The stable states can be obtained graphically by plotting the characteristic of the pull-down device and a load line, which is the characteristic of the pull-up device as shown in FIG. 4(b) or FIG. 4(c). In FIG. 4(b), the pull-down RTD 11 characteristic is represented by the solid lines, and the hysteretic characteristic of the pull-up RTD 13 in series with resistance 12 is represented by the dotted lines. The stable operating points are located where the two characteristics intersect at $S_{11} \ldots S_{(N+1)(N+1)}$. These operating points can be defined by a single variable $V_L$, which is the voltage at the joint between the pull-up device 12, 13 and the pull-down RTD 11. In FIG. 4(c), the pull-up device is taken as RTD 13 with dotted characteristic and the pull-down device is RTD 11 in series with resistance 12 with solid hysteretic characteristic. The stable operating points are again at $S_{11} \ldots S_{(N+1)(N+1)}$ and can be defined by the voltage $V_H$ at the joint of the pull-up RTD 13 and the pull-down RTD 11 in series with the resistance 11. It can be seen that in either FIG. 4(b) or FIG. 4(c), the number of stable operating points is equal to $(N+1)^2$, because every positive resistance region such as that in the voltage range $1_H$ in FIG. 4(c) intersects with the hysteretic characteristic at $(N+1)$ points $S_{11}, S_{21}, \ldots, S_{N1}, S_{(N+1)1}$ etc. For an N-peak RTD, there are $N+1$ stable operating points. If the RTD load also has N current peaks, there are $(N+1)$ positive resistance regions. For every voltage interval corresponding to one positive resistance section, there are $(N+1)$ current levels. Then, for a RTD load with N peaks, there are $(N+1)^2$ stable operating points with different combinations of currents and voltages.

In FIG. 4(b), if the stable operating points are defined by a single variable $V_L$, the voltage difference between states which lie in the same positive resistance section of the pull-down device such as $S_{11}, S_{12}, \ldots, S_{1(N+1)}$ within the section $1_L$ may be very small as the number of current peaks N increases, and the noise margin becomes very narrow. Moreover, there is a problem to WRITE the cell. Because of the hysteresis as shown in FIG. 4(b), it may require several steps to change the cell from one state to another state. For example, if it is desired to change the state from $S_{1(N+1)}$ to $S_{21}$, it is insufficient to apply a voltage at node L with a value equal to stable operating point $V_{21}$, because the final operating point for a hysteretic I-V characteristic depends on the history of the writing voltage. For the operating point to change from $S_{1(N+1)}$ to $S_{21}$, the writing voltage must first be increased beyond the right transitional voltage of the top hysteresis loop and then slide down along the top trace to the $2_L$ range of $V_L$, where the pull-up characteristic intersects with the pull-down characteristic. On the other hand, for changing from the state $S_{21}$ to the state $S_{1(N+1)}$, the writing voltage $V_L$ must first be decreased to below the left transitional voltage of the corresponding hysteresis loop before increasing to the $1_L$ range. If the initial state and the final state lie in different ranges of $V_L$, the writing voltage must trace through three voltage levels. Depending upon the cell's original quiescent state, the required writing signal for establishing the cell's final state can be either a pulsed or multi-stepped signal. This would be applicable to the single data line type cell as discussed above.

Similarly, the stable operating points at node H also have narrow noise margins as shown in FIG. 4(c), and require three-level writing voltages. Such voltage steps also slow down the writing time.

The shortcomings of using a single variable for defining the memory state can be overcome by using two variables to define a memory state. From FIG. 4(b) and FIG. 4(c), it can be seen that for any particular memory state $S_{ij}$, the node voltage $(V_L)_{ij}$ at node L is quite distinct from $(V_H)_{ij}$ at node H. Take the range $1_L$ in FIG. 4(b) for instance, for those states in this range $(V_{lj})$ at node L, where $1 \leq j \leq (N+1)$, the corresponding voltages $(V_H)$ at node H are located in different voltage ranges in FIG. 4(c). FIG. 4(d) shows the corresponding voltage ranges at nodes L and H for each stable state. From a different perspective, it can be seen that the operating currents of the stable states in the same voltage range, say $1_L$ in FIG. 4(b), are quite distinct. The current is equal to the voltage difference $(V_H - V_L)$ divided by the resistance. Thus, by using two variables $V_H$ and $V_L$, the memory states are clearly distinguishable.

The writing procedure using two variables is also simplified. For example, consider writing into the memory cell state $S_{kl}$, one need only to apply a voltage within the range $k_L$ at node L and a voltage within the range $l_H$ at node H simultaneously. The cell finally settles at the stable state $S_{kl}$. Thus, by using two variables, the writing step is simplified and speeded up. This type of memory cell with two accessing variables is referred to as a two-dimensional memory cell.

Figure 5:
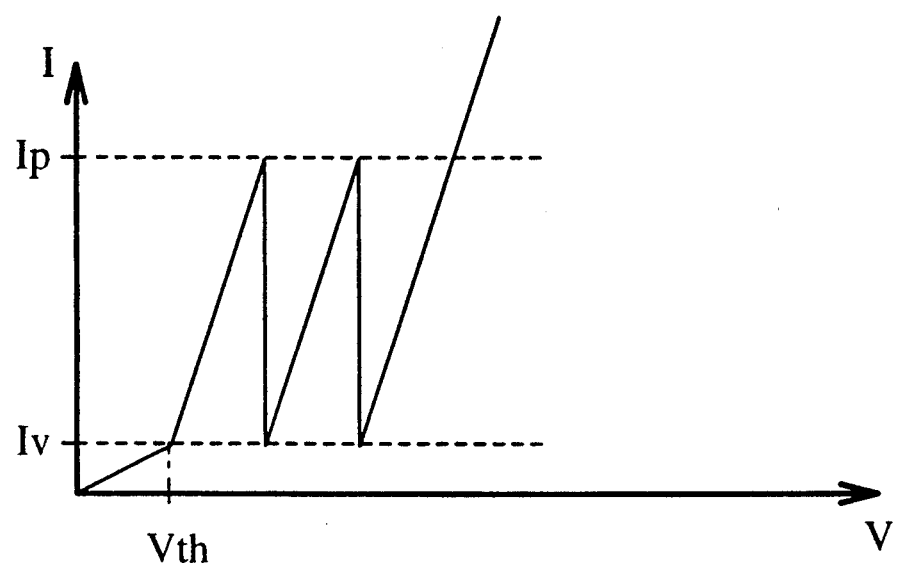
FIG. 5 shows the simplified I-V curve of a 2-peak RTD.

For simplicity, 2-peak RTDs will be used as examples hereafter with piecewise linear I-V characteristic shown in FIG. 5. FIGS. 6(a)-(d) are similar to FIGS. (a)-(d) except that 2-peak RTDs are used instead of the N-peak RTDs. With 2-peak RTDs, nine stable states are obtained.

Figure 8:
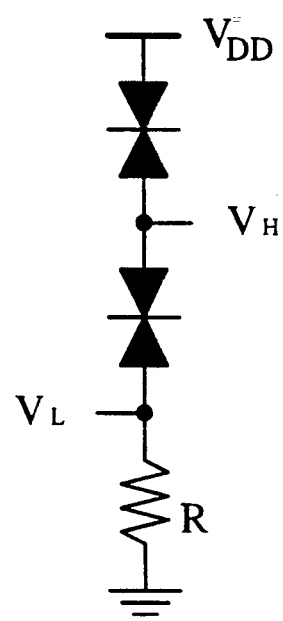
FIG. 8 shows a third version of a two-dimensional memory cell of this invention, by connecting two 2- peak RTDs in series with a resistor which is placed in the bottom.

FIG. 7(a) shows another version of the memory cell using 2-peak RTDs with the series resistor placed on the top. Similarly, the stable operating points at node L and node H can be obtained graphically by drawing the load lines as shown in FIG. 7(b) and FIG. 7(c). Once again, there are nine distinguishable combinations of $V_H$ and $V_L$, although some of the values of $V_H$ and $V_L$ are not very distinguishable. FIG. 7(d) shows the corresponding voltages at node L and node H for each stable state. FIG. 8 shows another version of the memory cell where the series resistor is placed at the bottom. Similar results of nine stable memory states can be obtained.

A current source can be used instead of the resistor as a pull-up device as shown in FIG. 9(a). The stable points at node H can be obtained graphically as shown in FIG. 9(b). The solid curve represent the combined I-V characteristic of two RTDs in series with hysteresis. The dotted curve represents the load line of the current source $I_o$, which intersects with the solid I-V characteristic to produce five or $(2N+1)$ stable operating points. The stable points at node L can also be obtained graphically as shown in FIGS. 9(c)-(g). These graphs are drawn with the solid curves as the I-V characteristic of the lower RTD, and the dotted curve as that of the upper RTD. In FIG. 9(c) for $V_H = V_{b1}$, the node voltage $V_L$ is at the intersection $V_{a1}$ of the solid curve and the load line, corresponding to the operating point $S_1$ with current $I_o$. In a similar manner for $V_H = V_{b2}$, the node voltages $V_L$ are found from FIG. 9(d) to be $V_{a1}$ and $V_{a2}$. This procedure is continued in FIGS. 9(e)-9(g) for all the possible values of $V_H$ for all the operating points $S_1 \ldots S_9$. FIG. 9(h) tabulates the nine or $(N+1)^2$ stable states with different combinations of voltages at node H and node L. From the foregoing description, it can be generalized that there are $(N+1)^2$ memory states when two N-peak RTDs are connected in series and accessed with bit lines as shown in FIGS. 11(a)-(d).

A two-dimensional memory cell can also be obtained by connected three RTDs in series as shown in FIG. 10(a). In this figure, the two lower RTDs produce a 4-peak folding I-V characteristic with hysteresis loops as shown by the solid curve in FIG. 10(b). The top RTD then has a dotted load line, which intersects with the solid curves at 9 points, A, B, C ... etc. corresponding to node voltages $V_H = V_{b1} \ldots V_{b9}$. For any particular value of $V_H$, there may be different values of $V_L$ to satisfy the same series current I1, I2 or I3, as shown in FIGS. 10(c)-10(k). Take $V_H = V_{b2}$ as shown FIG. 10(d), the V-I characteristic of the lowest RTD is shown as solid lines, and that of the middle RTD serving as the load for the lowest RTD is shown in dotted lines. It can be seen that for the same current I2 as $V_{b2}$ in FIG. 10(b), there are two possible values of $V_L$, $V_{a2}$ and $V_{a5}$. FIG. 10(l) tabulates all the possible combinations. For this illustration with 2-peak RTDs, the total number of states is equal to 19. It can be derived that the total number of states is greater than $(N+1)^2$.

FIGS. 12(a)-(d) shows some other versions of the memory cell comprising two RTD in series with a resistor with only a single data line. Operation of these devices is comparable to those devices shown in FIGS. 6(a),(b)&(c) and FIGS. 7(a),(b)&(c). Further, the resistance value for the device is selected so that hysteresis of the combined voltage-current characteristic overlaps.

The same scheme can be extended to more than two dimensional operating points. When three RTDs are connected in series with a resistor as shown in FIG. 13(a) or in series with a current source as shown in FIG. 13(b), then there can be $(N+1)^3$ stable operating points. In FIG. 13(c), four RTDs are connected in series and there are more than $(N+1)^3$ stable states. For this case, three data lines are required to read and write the memory cell. With similar deduction, when m number of RTDs are connected in series as shown in FIG. 14(a) and FIG. 14(b), there can be $(N+1)^m$ number of stable states, and m data lines are required to access the memory cell. If $(m+1)$ RTDs only are connected in series as shown in FIG. 14(c), even more than $(N+1)^m$ stable states can be obtained.

Another feature of an RTD is that the folding characteristic exists for both the positive polarity power supply and the negative polarity power supply. The I-V characteristic in the first quadrant and the third quadrant of an RTD is shown in FIG. 15. Thus, when a single-pole double-throw switch is placed at the VDD terminal of any of the cells described earlier as shown in FIG. 16, the number of memory states can be doubled. Then, for the multi-dimensional memory cell shown in FIG. 14(a) or FIG. 14(b), the number of states becomes $2(N+1)^m$. To implement this technique, CIP application Ser. No. 07/871806 is hereby incorporated by reference.

Obviously numerous modifications and variations of the present invention are possible in light of the above teaching. The memory cell can be designed so that the quantum states can be defined by the nodal voltages or series current of the cell. Other features include the cell's parallel processing capability of allowing for writing in one step all data into the multiple nodes simultaneously versus a sequential manner as in a single data input line case. It is understood that within the scope of the appended claims, the invention may be practiced otherwise then as specifically described herein.

We claim:

1. A memory cell for storing plural logical states comprising:
    first and m-second type devices that are selected to operate in a hysteretic condition;
    the first type device that is a loading means on the memory cell that enables the memory cells multiple operating points;
    the m-second type devices each having a folding voltage-current characteristic with N peaks where $N \geq 1$;
    wherein the first and second type devices are adapted to be connected in series across a power supply which is adjusted to produce a required number of stable logical operating states for the memory cell; and
    at least one access line that attaches to access memory data means to each node point of the series connected first and m-second type devices which are not at the power supply's potential or ground node point whereby the memory cell can enable the required number of stable logical operating states of the memory cell.

2. The memory cell as recited in claim 1 wherein the access memory data means allows for writing into the cell by parallel data signal processing at more than one node of the memory cell.

3. The memory cell as recited in claim 1 wherein the first type device and m second type devices are resonant tunneling diodes such that greater than $(N+1)^m$ stable logical operating states can be enabled and $m \geq 2$.

4. The memory cell as recited in claim 3 wherein the potential node of the device includes a means for connecting either a positive power supply or a negative power supply with respect to the memory cell's ground node reference thereby doubling the number of logical states.

5. The memory cell as recited in claim 1 wherein the loading means is a resistor that induces hysteresis in the second devices voltage-current folding characteristic such that up to $(N+1)^m$ stable logical operating states can be enabled.

6. The memory cell as recited in claim 5 wherein the potential node of the device includes a means for connecting either a positive power supply or a negative power supply with respect to the memory cells ground node reference thereby doubling the number of logical states.

7. The memory cell as recited in claim 1 wherein there is only one access line.

8. The memory cell as recited in claim 7 wherein the access memory data means for writing has only one defined type signal input.

9. The memory cell as recited in claim 8 wherein the signal input is of a single pulse type characteristic.

10. The memory cell as recited in claim 8 wherein the signal input is of a multi-step type characteristic.

11. The memory cell as recited in claim 7 wherein the potential node of the device includes a means for connecting either a positive power supply or a negative power supply with respect to the memory cells ground node reference thereby doubling the number of logical states.

12. The memory cell as recited in claim 1 wherein the loading device is a current source with a high internal impedance such that up to $(N+1)^m$ stable logical operating states can be enabled.

13. The memory cell as recited in claim 12 wherein the potential node of the device includes a means for connecting either a positive power supply or a negative power supply with respect to the memory cells ground node reference thereby doubling the number of logical states.

14. The memory cell as recited in claim 1 wherein the potential node of the device includes a means for connecting either a positive power supply or a negative power supply with respect to the memory cells ground node reference thereby doubling the number of logical states.

15. A memory system for storing plural logic states comprising:
    an array of memory cells with address means for addressing the memory cells;
    a reading means for reading the memory cells;
    a writing means for writing onto the memory cell wherein each memory cell includes a first and m-second type devices that are selected to operate in a hysteretic condition;
    the first type device is a loading means on the memory cell that enables the memory cell's multiple operating points;
    the m-second type devices each having a folding voltage-current characteristic with N peaks where $N \geq 1$;
    wherein the first and m-second type devices are adapted to be connected in series across a power supply which is adjusted to produce a required number of stable logical operating states for the memory cell; and
    at least one access line that attaches the access memory data means to each node point of the series connected first and second devices which are not at the power supply's potential or ground node point whereby the memory cell can enable the required number of stable logical operating states of the memory cell.

16. The memory system as recited in claim 15 wherein each memory cell's access memory data means allows for writing into the cell by parallel data signal processing at more than one node of the memory cell.

17. The memory system as recited in claim 15 wherein each memory cell's first type device and m-second type devices are resonant tunneling diodes such that greater than $(N+1)^m$ stable logical operating states can be enabled and $m \geq 2$.

18. The memory system as recited in claim 17 wherein each memory cell's power supply's potential node of each cell includes a means for connecting either a positive power supply or a negative power supply with respect to the memory cell's ground node reference thereby doubling the number or required operating states.

19. The memory system as recited in claim 15 wherein each memory cell's loading means is a resistor that induces hysteresis in the second devices voltage-current folding characteristic such that up to $(N+1)^m$ stable logical operating states can be enabled.

20. The memory system as recited in claim 19 wherein each memory cell's power supply's potential node of each cell includes a means for connecting either a positive power supply or a negative power supply with respect to the memory cell's ground node reference thereby doubling the number or required operating states.

21. The memory system as recited in claim 15 wherein each memory cell has only one access line.

22. The memory system as recited in claim 21 wherein the access memory data means for writing has only one defined type signal input.

23. The memory system as recited in claim 22 wherein the signal input is of a single pulse type characteristic.

24. The memory system as recited in claim 22 wherein the signal input is of a multi-step type characteristic.

25. The memory system as recited in claim 21 wherein each memory cell's power supply's potential node of each cell includes a means for connecting either a positive power supply or a negative power supply with respect to the memory cell's ground node reference thereby doubling the number or required operating states.

26. The memory system as recited in claim 15 wherein each memory cell's loading device is a current source with a high internal impedance such that up to $(N+1)^m$ stable logical operating states can be enabled.

27. The memory system as recited in claim 26 wherein each memory cell's power supply's potential node of each cell includes a means for connecting either a positive power supply or a negative power supply with respect to the memory cell's ground node reference thereby doubling the number or required operating states.

28. The memory system as recited in claim 15 wherein each memory cell's power supply's potential node of each cell includes a means for connecting either a positive power supply or a negative power supply with respect to the memory cell's ground node reference thereby doubling the number of logical states.

* * * * *